June 11, 1968 W. M. AUSTIN 3,388,338
GAIN CONTROLLED AMPLIFIER USING FIELD EFFECT TYPE
TRANSISTOR AS THE ACTIVE ELEMENT THEREOF
Filed June 13, 1966

INVENTOR.
WAYNE M. AUSTIN
BY
Eugene M. Whitacre
Attorney

United States Patent Office 3,388,338

Patented June 11, 1968

3,388,338

GAIN CONTROLLED AMPLIFIER USING FIELD EFFECT TYPE TRANSISTOR AS THE ACTIVE ELEMENT THEREOF

Wayne M. Austin, Hanover, N.J., assignor to Radio Corporation of America, a corporation of Delaware Filed June 13, 1966, Ser. No. 557,313
8 Claims. (Cl. 330—29)

Figure 1:
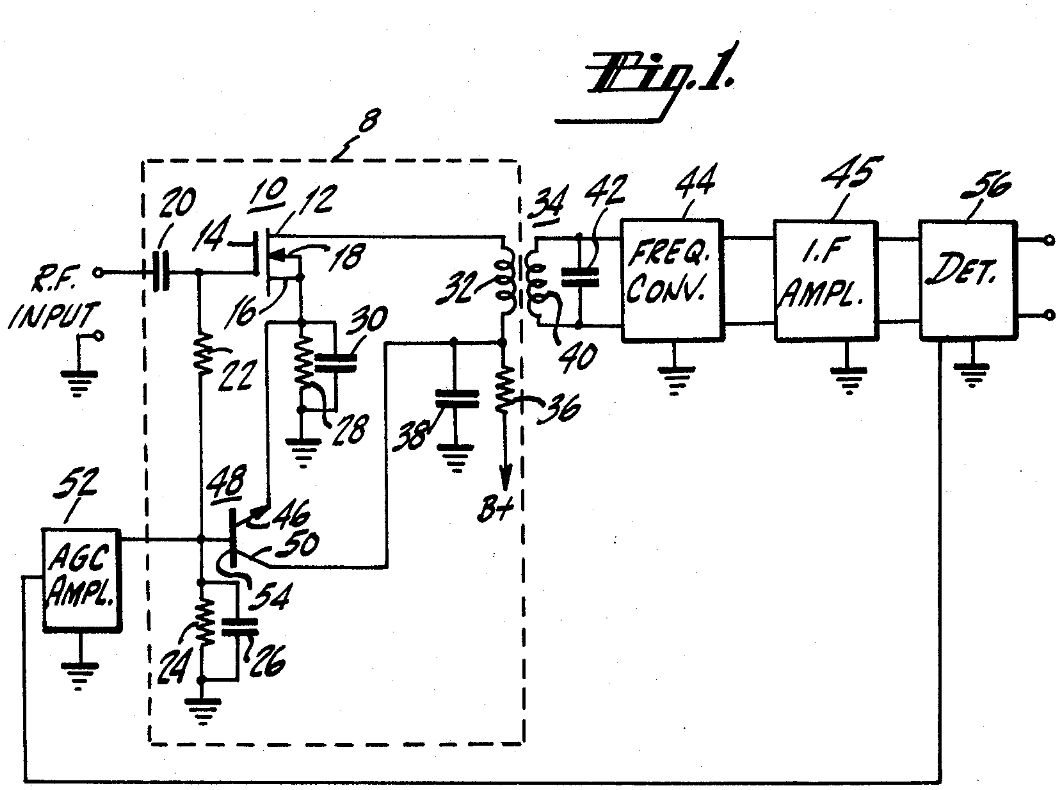

This invention relates to gain controlled amplifiers, and more particularly to gain controlled amplifiers using field effect type transistors as the active elements thereof.

In the design of gain controlled radio frequency (R.F.) and intermediate frequency (I.F.) amplifier stages employing semiconductor devices such as transistors, a serious problem has existed with respect to cross-modulation distortion. As signal level increases from a minimum usable level, it is common practice to apply an automatic gain control (A.G.C.) voltage to the device in a direction to reverse bias its signal input electrodes and thereby decrease the device output current and gain to maintain the output signal substantially constant. The transfer characteristic of such known semiconductor devices becomes very non-linear as the gain and current are reduced so that a relatively small amount of interfering signal produces relatively high cross-modulation distortion of the signal being amplified as compared to amplifier circuits using vacuum tubes. Unfortunately, most known semiconductor devices including bi-polar and field effect transistors exhibit poor cross-modulation characteristics over a relatively large reverse A.G.C. range.

In order to reduce the cross-modulation distortion of such circuits it is known that the amplifier gain can be reduced from a maximum value by applying a forward bias control voltage which tends to increase the output current of the semiconductor device as the input signal level increases. The cross-modulation distortion produced in a circuit of this type is reduced as compared to a circuit wherein the gain is reduced by decreasing the device output current. However, in regard to insulated gate field effect transistors, the amount of forward control voltage that can be applied to the gate electrode is limited by the physical characteristics of the device; i.e., the application of a substantial forward gate-to-source bias voltage deleteriously affects the life of insulated gate field effect transistors. Thus, the restricted range of forward gate bias allows only a relatively limited range of amplifier gain reduction.

Accordingly it is an object of the present invention to provide an improved gain controlled amplifier using field effect type semiconductor devices which exhibits low cross-modulation distortion.

It is a further object of the present invention to provide an improved variable gain amplifier circuit employing field effect type transistors, which exhibits low cross-modulation distortion and has an extended A.G.C. range.

A circuit embodying the invention includes a semi-conductor device, such as an insulated gate field effect transistor, connected as the active element of a gain controlled amplifier. The circuit includes means effective over a first range of gain control voltages to increase forward bias between the input electrodes of the device as a function of the magnitude of an applied input signal to be amplified. Over a second range of gain control voltages the means is effective to maintain the forward bias substantially constant and to decrease the operating potential to the device output electrode as a function of further increases of the applied signal level. As a result, the amplifier gain is first reduced by a change in the input electrode bias, in the forward direction, and thereafter the amplifier gain is further reduced by a decrease in the operating potential to the output electrode.

Figure 2:
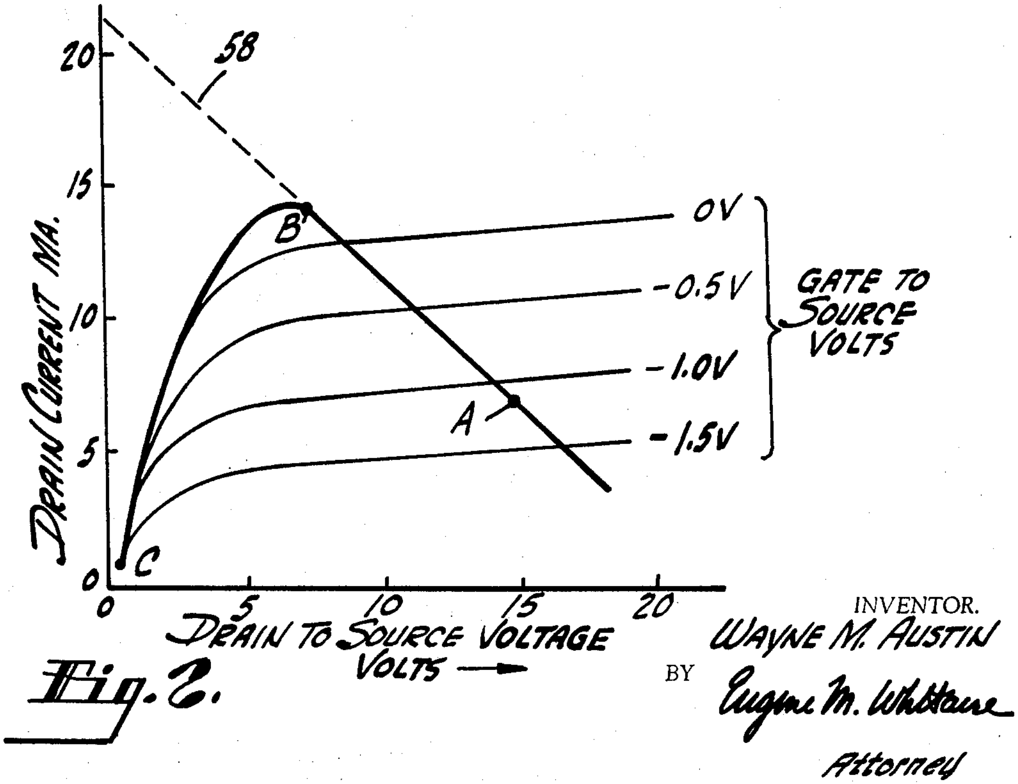

The novel features which are considered characteristic of the invention are set forth with particularity in the appended claims. The invention itself, however, both as to its organization and method of operation as well as additional objects thereof will best be understood from the accompanying drawings in which:

FIGURE 1 is a schematic circuit diagram partly in block form of a gain controlled amplifier embodying the invention; and FIGURE 2 is a graph showing a family of drain current versus source-to-drain voltage curves for various of gate-to-source voltage of the field effect transistor utilized in the circuit of FIGURE 1.

Referring now to FIGURE 1, a gain controlled radio frequency amplifier 8 includes a field effect transistor 10 having drain, gate and source electrodes 12, 14, and 16 respectively and a substrate electrode 18. In the illustrated embodiment the field effect transistor 10 is of a type referred to as an N channel insulated gate or MOS transistor.

Transistor 10 is connected in common source configuration with the substrate electrode 18 directly connected to the source electrode 16. An alternating current input signal path is provided through a coupling capacitor 20 to the gate electrode 14 of the transistor 10. A pair of resistors 22 and 24 are serially connected between the gate electrode 14 and ground with the resistor 24 being bypassed at signal frequencies by a capacitor 26. The source electrode 16 is connected to ground through a source resistor 28 bypassed at signal frequencies by a capacitor 30. The drain electrode 12 is connected through the primary winding 32 of an output signal coupling R.F. transformer 34 in series with a signal decoupling or drain dropping resistor 36 to a source of fixed potential B+. Resistor 36 is bypassed to ground at signal frequencies by a capacitor 38. As shown, the transformer primary winding 32 serves as an A-C load impedance and the B+ potential provides the operating means or drain-to-source bias for the establishment of drain-to-source current flow in the transistor 10. The transformer secondary winding 40 resonates with a capacitor 42 at the desired signal frequency, and the signal developed thereacross is translated through a frequency converter 44, and I.F. amplifier 45 and an amplitude modulation detector 56.

The source electrode 16 is connected to the emitter electrode 46 of an N-P-N type junction transistor 48, and the drain electrode 12 is connected via the transformer primary winding 32 to the junction transistor collector electrode 50. An A.G.C. amplifier 52 providing a source of direct automatic gain control voltage is coupled across the resistor 24 which is common to the gate 14 circuit of the field effect transistor 10 and the base 54 circuit of the junction transistor 48. The A.G.C. amplifier 52 which is driven by the detector 56, provides a D.C. control voltage, the magnitude of which increases in the positive direction as a function of the strength of the R.F. input signal being applied to the field effect transistor 10.

The operation of the circuit shown in FIGURE 1 will now be described. Initially the A.G.C. amplifier 52 causes a direct voltage, such as zero volts, to be developed across the resistor 24 such that the combined voltages developed across the resistors 24 and 28 reverse bias the base-emitter junction of the transistor 48. At this time the transistor 10 is biased to provide maximum gain which is determined by the amplifier 8 circuit parameters.

Over a first range of gain controlling voltages the gain of the amplifier circuit 8 is reduced by causing the A.G.C. amplifier 52 to develop a more positive going voltage across the resistor 24. This first range of gain controlling voltages is insufficient to overcome the reverse bias applied to the base-emitter junction of the transistor 48, and hence the transistor 48 is cut-off and effectively out of the circuit. However, the increasing positive voltages of the first range of voltages are applied through the resistor 22 to the gate electrode 14 of the transistor 10 causing an increase in current therein and the reduction of gain.

When the positive-going voltage from the A.G.C. amplifier 52 reaches a certain level, the base-emitter junction of the transistor 48 becomes conductive, thereby clamping the gate-to-source voltage of the field effect transistor 10 at a fixed level corresponding to the base-emitter voltage of the transistor 48. Where the transistor 48 is a silicon transistor, the base-emitter voltage is approximately 0.6 volt. Further increases in the positive-going voltage from the A.G.C. amplifier 52 do not produce a change in the gate-to-source bias voltage, but cause increasing conduction between the collector and emitter electrodes of transistor 48. This action effectively reduces the drain-to-source voltage applied to the field effect transistor 10 causing a further reduction in gain.

With reference to the family of drain current verses source-to-drain voltage curves of FIGURE 2, the initial operating point for maximum gain is represented by the point A. Over the first range of gain controlling voltages where the junction transistor 48 is reversed biased and effectively presents an open circuit, the positively going control voltage causes the field effect transistor 10 to conduct more current. The increasing source-to-drain current of the transistor 10 follows the load line 58, which is determined by the source and drain resistors 28 and 36, to a point B at which time the gate-to-source bias voltage is clamped to a relatively fixed value by the forward biased base-emitter junction of the transistor 48. Further increases in the gain controlling voltage cause increasing conduction of the transistor 48, and hence a reduction in the source-to-drain voltage of the transistor 10. In effect, the junction transistor 48 acts as a voltage controlled variable impedance means shunting the drain-to-source electrodes of the field effect transistor 10. The limit to the reduction of drain current and amplifier gain as indicated by point C is determined by the collector-to-emitter saturation voltage of the junction transistor 48.

It has been found that the transfer characteristic of the amplifier 8 exhibits better immunity to cross-modulation distortion as the gain is reduced by increasing the current through the transistor 10 than for amplifiers using similar active devices where the gain is reduced by decreasing the source-drain current. The transfer characteristic at the point where the gate-to-source voltage is clamped to a fixed value is relatively linear contributing to excellent cross-modulation performance over the A.G.C. range where the source-to-drain voltage is reduced. Since the gate electrode is not maintained at a direct voltage level which is substantially positive with respect to the source electrode, the lifetime of the insulated gate field effect transistor is increased.

A particular set of values for the embodiment shown in FIGURE 1 which has provided satisfactory operation is set forth below. It will be appreciated that these values are given by way of example only.

| | |
|---|---|
| Resistor 22 | 15,000 ohms. |
| Resistor 24 | 10,000 ohms. |
| Resistor 28 | 220 ohms. |
| Resistor 36 | 820 ohms. |
| Transistor 10 | RCA type TA2840. |
| Transistor 48 | 2N3241. |
| B+ | +22 volts D.C. |

While the above described circuit embodiment has been shown utilizing an N channel field effect transistor and an NPN junction transistor, it is to be understood that a P channel field effect transistor and PNP junction transistor could be used in the circuit with corresponding changes in the polarity of the operating potential, and A.G.C. control voltage.

What is claimed is:

1. A circuit for controlling the gain of an amplifier comprising:
   - a first semiconductor device having input, output and common electrodes;
   - signal input circuit means coupled between the input and common electrodes of said first device;
   - signal output circuit means coupled between the output and common electrodes of said first device;
   - a second semiconductor device comprising a junction transistor having base, emitter and collector electrodes;
   - means providing a direct current connection between said base electrode and one of said input and common electrodes;
   - means providing a direct current connection between said emitter electrode and the other of said input and common electrodes;
   - means providing a direct current connection between said collector electrode and said output electrode;
   - means providing a source of gain controlling potential which increases in a pre-determining polarity direction to reduce the gain of said amplifier;
   - means including said source of gain controlling potential connected between said base and emitter electrodes so that said base and emitter electrodes are initially reverse biased, but increases in said gain controlling potential in said polarity direction reduces said reverse bias over a first range of said gain controlling potential and forward biases said base and emitter electrodes over a second range of said gain controlling potential.

2. A circuit as defined in claim 1 wherein said first semiconductor device comprises an insulated gate field effect transistor having gate, source and drain electrodes.

3. A circuit as defined in claim 2 wherein said base electrode is connected to said gate electrode and said emitter electrode is connected to said source electrode.

4. A gain controlled amplifier comprising:
   - a semiconductor device having a source electrode, a gate electrode, and a drain electrode;
   - means coupling said source electrode to a point of reference potential;
   - load impedance means coupling said drain electrode to a point of fixed potential with respect to said reference potential;
   - means coupled between said gate electrode and said point of reference potential providing a signal input circuit for an applied signal;
   - circuit means coupled to said input circuit for applying a control voltage to said gate electrode, said control voltage being effective to cause drain-source current flow to increase as the magnitude of said applied signal increases up to a predetermined level so as to provide a reduction in the gain of said amplifier; and
   - variable impedance means connected in direct current circuit path between said drain and source electrodes and responsive to said control voltage for providing a decrease in the impedance of said circuit path between said drain and source electrodes as the magnitude of said applied signal is increased above said pre-determined level so as to provide a further reduction in the gain of said amplifier.

5. A gain controlled amplifier as defined in claim 4 wherein said variable impedance means includes:
   - a transistor having an emitter electrode, a base electrode and a collector electrode, said emitter and collector electrodes being respectively connected in direct current circuit path to the source and drain electrodes of said semiconductor device, and said base electrode being responsive to said control voltage for causing a decrease in the collector-to-emitter impedance of said transistor when the magnitude of said input signal exceeds said pre-determined level, thereby providing a decrease in the drain-to-source current flow of said semiconductor device and a reduction in the gain of said amplifier.

6. A gain controlled amplifier according to claim 5 wherein said semiconductor device comprises an insulated gate field effect transistor.

7. A gain controlled amplifier as defined in claim 6 wherein said base electrode is connected in direct current circuit path to said gate electrode so that said gate-to-source voltage is clamped to said base-to-emitter voltage when the magnitude of said input signal exceeds said pre-determined level.

8. A gain controlled amplifier according to claim 7 wherein said load impedance means includes:

an output circuit having one end connected to said drain electrode; and a resistor connected between the other end of said output circuit and said point of fixed potential, said collector electrode being connected to the junction of said output circuit and said resistor in direct current circuit path with said drain electrode.

References Cited

UNITED STATES PATENTS 3,036,275 5/1962 Harmer ------------ 330—29

JOHN KOMINSKI, *Acting Primary Examiner.*

ROY LAKE, *Examiner.*

J. B. MULLINS, *Assistant Examiner.*